United States Patent
Chiu et al.

(10) Patent No.: US 8,047,379 B2
(45) Date of Patent: Nov. 1, 2011

(54) WAFER CONTAINER WITH PURGEABLE SUPPORTING MODULE

(75) Inventors: Ming-Long Chiu, Shulin (TW); Kuo-Chun Hung, Shulin (TW)

(73) Assignee: Gudeng Precision Industrial Co., Ltd, Shulin (TW)

( * ) Notice: Subject to any disclaimer, the term of this patent is extended or adjusted under 35 U.S.C. 154(b) by 450 days.

(21) Appl. No.: 12/202,389

(22) Filed: Sep. 1, 2008

(65) Prior Publication Data

US 2010/0051503 A1  Mar. 4, 2010

(30) Foreign Application Priority Data

Aug. 27, 2008 (TW) .............................. 97132635 A

(51) Int. Cl.
  *B65D 85/30* (2006.01)
  *H01L 21/673* (2006.01)
(52) U.S. Cl. ........................ 206/711; 206/710
(58) Field of Classification Search .................. 206/711, 206/710, 832, 833, 454, 522, 723, 455, 445, 206/307.1; 211/41.18; 220/86.1
See application file for complete search history.

(56) References Cited

U.S. PATENT DOCUMENTS

| | | | | |
|---|---|---|---|---|
| 5,879,458 A | * | 3/1999 | Roberson et al. | 118/715 |
| 5,890,598 A | * | 4/1999 | Hayashida et al. | 206/710 |
| 6,098,809 A | * | 8/2000 | Okada et al. | 206/711 |
| 6,099,302 A | * | 8/2000 | Hong et al. | 432/259 |
| 6,736,268 B2 | | 5/2004 | Nyseth | |
| 6,899,145 B2 | * | 5/2005 | Aggarwal | 141/11 |
| 7,009,689 B2 | * | 3/2006 | Chiu | 355/75 |
| 2006/0011507 A1 | * | 1/2006 | Uchida et al. | 206/711 |
| 2006/0283774 A1 | | 12/2006 | Hasegawa | |

* cited by examiner

*Primary Examiner* — Steven A. Reynolds
(74) *Attorney, Agent, or Firm* — Ming Chow; Sinorica, LLC

(57) ABSTRACT

A wafer container includes a container body, formed by a pair of side walls, a top surface, and a bottom surface, on one sidewall of which is formed with an opening and on the other sidewall opposite to the opening is formed with a back wall, a supporting module being disposed on each of said sidewall for supporting a plurality of wafers; and a door joining with opening of the container body with its inner surface for protecting the plurality of wafers within the container body, the characteristic in that: a purgeable supporting module is respectively disposed between each side wall of the container body and the back wall, a long slot is further disposed on the side of purgeable supporting module facing the opening, and an air inlet is further disposed on one end of the purgeable supporting module for being connected to an gas valve, wherein the purgeable supporting module is formed by a plurality of supporting ribs vertically arranged at intervals.

22 Claims, 13 Drawing Sheets

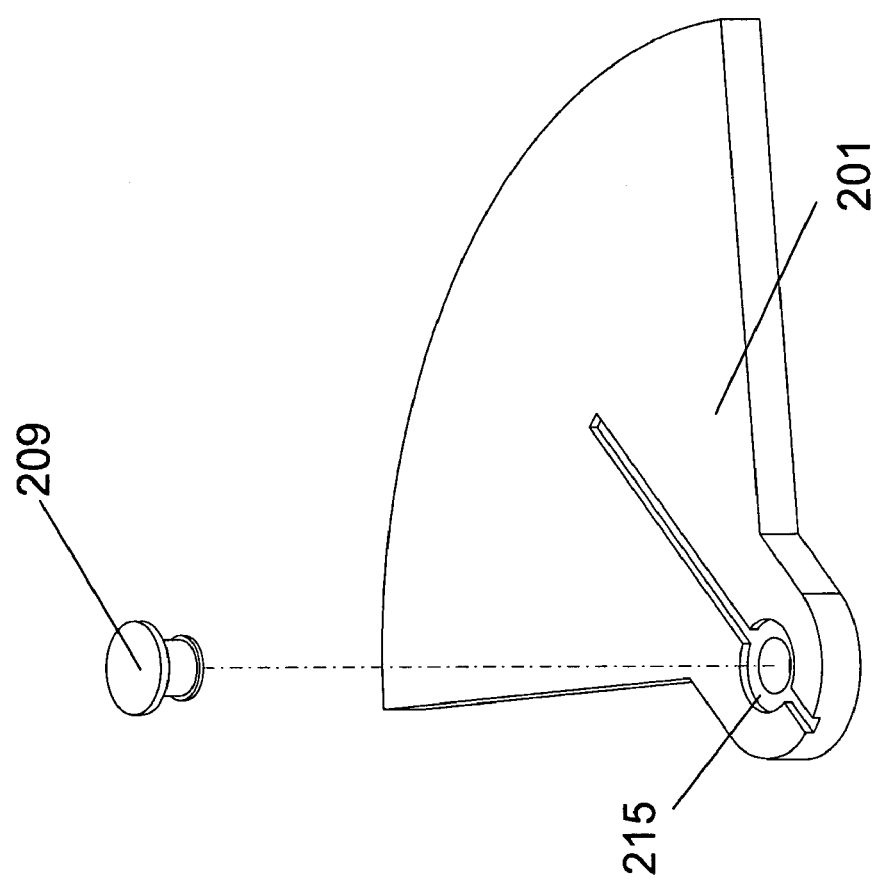

WAFER CONTAINER WITH PURGEABLE SUPPORTING MODULE

BACKGROUND OF THE INVENTION

1. Field of the Invention

The present field of the invention is related to a wafer container, and more particularly, to a wafer container disposed with inflatable supporting component for gas to form a gas flow in the wafer container.

2. Description of the Prior Art

The semiconductor wafers are transferred to different stations to apply the various processes in the required equipments. A sealed container is provided for automatic transfer to prevent the pollution from occurring during transferring process. FIG. 1 shows the views of wafer container of the conventional prior art. The wafer container is a front opening unified pod (FOUP) which includes a container body 10 and a door 20. The container body 10 is formed with a pair of side walls 10L and a top surface 10T and a bottom surface 10B adjacent to the pair of side walls 10L. An opening 12 is formed on one sidewall and a back wall (not shown in Figure) is formed on the other sidewall opposite to the opening 12. Wherein a plurality of slots 11 are disposed respectively on the pair of sidewalls 10L for horizontally supporting a plurality of wafers. The door 20 includes an outer surface 21 and an inner surface 22, and joins with the opening 12 of the container body 10 with the inner surface 22 for protecting the plurality of wafers within the container body 10. In addition, at least a latch hole 23 is disposed on the outer surface 21 of the door 20 for opening or closing the wafer container. According to the aforementioned, due to that the wafers are horizontally placed within the container body 10, thus, a wafer restraint component is needed in the FOUP to prevent the wafers from displacement or from movement toward the opening 12 of container body 10 occurring during the wafer transportation due to vibration.

FIG. 2 is a view of a front opening unified pod (FOUP) as described in U.S. Pat. No. 6,736,268. As shown in FIG. 2, the inner surface 22 of the door 20 is disposed with a recess 24 and the recess 24 is extended from the top 221 of the inner surface 22 to the bottom 222, and is located between two locking components 230 (inside of the door 20). A wafer restraint module (not shown in Figure) is further disposed in the recess 24. The wafer restraint module consists two wafer restraint components 100, and each wafer restraint component 100 includes a plurality of wafer contact heads 110 to sustain corresponding wafers, so as to prevent the wafer from displacement or movement toward the door opening due to vibration occurring in the wafer transportation procedure.

The slots 11 on two sidewalls 10L of the container body 10 and the wafer restraint module on the inner surface 22 of the door 20 are used respectively for supporting and restricting the plurality of wafers within the container body 10. Friction between these supporting components and restraint components and the wafers easily occurs during the transferring process of wafer container and results in generation of particles. When particles are generated inside the container body 10 of wafer container, these particles may stay on the surface of wafers or pollute the wafers, which cause decrease of yield for later production of chips. Therefore, a material with wear-resisting property can be used for the design of supporting components and restraint components of wafer container to prevent from too many particles generated when supporting components and restraint components contact the wafers. As shown in FIG. 3, which is a sectional view of supporting module on two sidewalls of wafer container as disclosed in U.S. patent No. 2006/0283774. This supporting module is formed by a plurality of supporting components 500 vertically arranged at intervals, and the surface of supporting components 500 is coated with a layer of resin 501 of low friction for preventing particles from being generated due to friction between supporting components 500 and the wafers. However, since the layer of resin 501 according to the design is with a slope, the wafers can only be supported near the edges when being supported by the layer of resin 501. Thus when the size of wafers is larger, the wafers droop or sink more easily, which not only makes it easier for wafers to crack but also results in chips or damage to wafers more easily when the mechanical arm exports the wafers.

In addition, in some other designs, a blowout opening or an edge is provided inside the wafer container, for example, close to where the wafers and the above-mentioned supporting components or restraint module contact, for carrying particles generated due to friction away from the wafers. As shown in FIG. 4, which is a view of inflatable supporting module that can be disposed inside the wafer container as disclosed in U.S. Pat. No. 6,899,145. This inflatable supporting module includes a hollow main body 600 which is fixed to sidewall of container body of wafer container with a plurality of vertical supporting components 601 extending to the interior of container body for supporting the plurality of wafers inside the container body with upper surface 602 of supporting components. And the side surface 603 of the supporting components is a bar-shaped slit for gas of the interior of hollow main body 600 to be blown out from for preventing particles generated due to friction from forming on the surface of wafers. In the above-mentioned structure, since the bar-shaped slit is disposed on side surface 603 of supporting components 601, the supporting force may not be enough and displacement or overlapping of wafers may thus occur and cause more serious damages to wafers. Moreover, when wafers are carried by the upper surface 602 of supporting components 601, the contact area between wafers and supporting components 601 is fairly large, which makes it much easier for particles to generate. And since the length of the bar-shaped slit is about as long as wafers, the gas flow may be small or larger inflation equipment may be needed for providing larger gas flow to form effective gas flow. Therefore, an inflatable supporting module with a more comprehensive design is needed for being disposed in the wafer container to effectively prevent particles from generating and forming on the surface of wafers.

SUMMARY OF THE INVENTION

In inflatable supporting module disposed in the container body of wafer container of prior art, there are problems such as that the force for supporting wafers may not be enough, that the contact area is too large, and that particles may generate easily. One objective of the present invention is thus to provide a front opening unified pod (FOUP) with inflatable supporting module disposed between sidewall and back wall of container body, wherein the inflatable supporting module includes at least a long slit facing the direction of the opening for blowing out gas to control the circumstances of the interior of the front opening unified pod, controlling internal atmosphere pressure, humidity, or kinds of gases for example.

Another objective of the present invention is to provide a front opening unified pod (FOUP) with inflatable supporting module that includes at least a long slit facing the direction of the opening for blowing out gas to form a gas flow field in order to carry away particles on wafers and prevent particles from forming on the wafers.

Still another objective of the present invention is to provide a front opening unified pod (FOUP) with inflatable supporting module that is composed of a plurality of supporting components or supporting ribs vertically arranged at intervals, wherein each of the supporting components or supporting ribs further includes a wear-resisting supporting knob for contacting wafers, the merits of which being the decrease of contact area between wafers and supporting components or supporting ribs and the reduction of particles generated due to friction with wafers.

And still another objective of the present invention is to provide a front opening unified pod (FOUP) with inflatable supporting module disposed between sidewall and back wall of container body and including an array of plurality of supporting components or supporting ribs vertically arranged at intervals and an array of plurality of restraint components vertically arranged at intervals, wherein the plurality of supporting components are closer to the sidewall of the container body and the plurality of restraint components are closer to the back wall of the container body and thus not only can the wafers be supported by the inflatable supporting module, but the wafers can also be prevented from moving toward the back wall to reduce particles generated.

And still another objective of the present invention is to provide a front opening unified pod (FOUP) with inflatable supporting module, the front end of each supporting rib on the inflatable supporting module being disposed with a protruding piece for contacting the back side of wafers; thus, with the length of supporting ribs, wafers of larger size can be better supported without drooping or sinking and the yield of wafer process can also be increased.

According to above objectives, the present invention discloses a front opening unified pod (FOUP), which includes a container body and a door. The container boy is formed by a pair of sidewalls, a top surface, and a bottom surface, wherein an opening is formed on one sidewall and a back wall is formed on the other sidewall opposite the opening, and a pair of supporting modules are further disposed on the pair of sidewalls for supporting a plurality of wafers. The door includes an outer surface and an inner surface; the door joins with the opening of the container body via its inner surface for protecting the plurality of wafers in the container body. The characteristic of front opening unified pod (FOUP) in that: an inflatable supporting module is further respectively disposed between each of the pair of sidewalls and the back wall of the container body, a long slit is disposed on the inflatable supporting module facing the direction of the opening, and a gas inlet is further disposed on one end of the inflatable supporting module and connected with a gas valve of the bottom surface, the inflatable supporting module being composed of a plurality of supporting ribs vertically arranged at intervals. Moreover, the inflatable supporting module can further include a plurality of restraint components vertically arranged at intervals to restrict wafers from moving toward the back wall of the container body.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 11A and FIG. 11B are views of another design of inflatable supporting module in a front opening unified pod (FOUP) of the present invention.

DESCRIPTION OF THE PREFERRED EMBODIMENT

In order to disclose the skills applied in, the objectives of, and the effects achieved by the present invention in a more complete and clearer manner, preferred embodiments are herein described below in detail with related drawings disclosed for reference.

Figure 1:
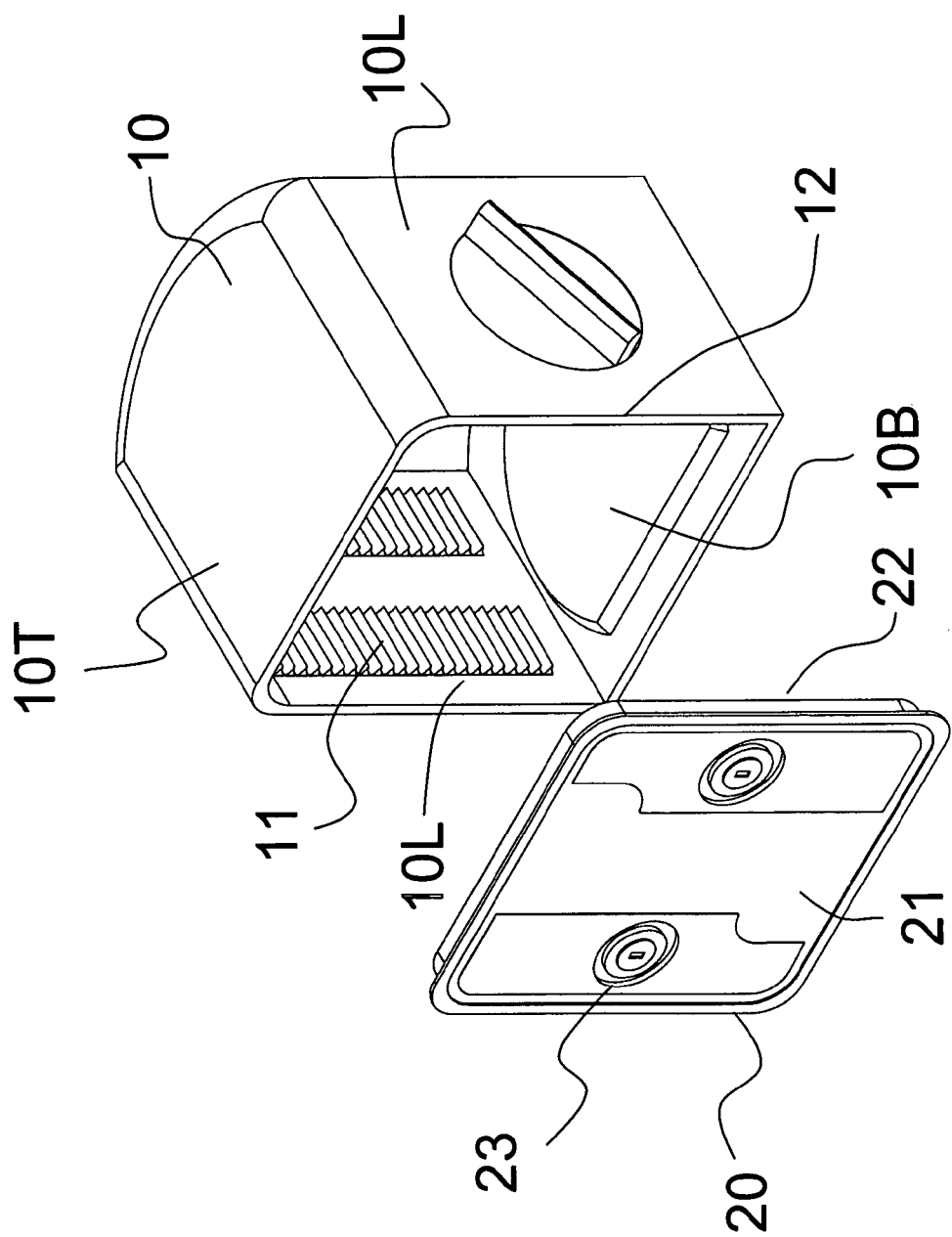
FIG. 1 is a view of a front opening unified pod (FOUP) of the prior art.
Figure 2:
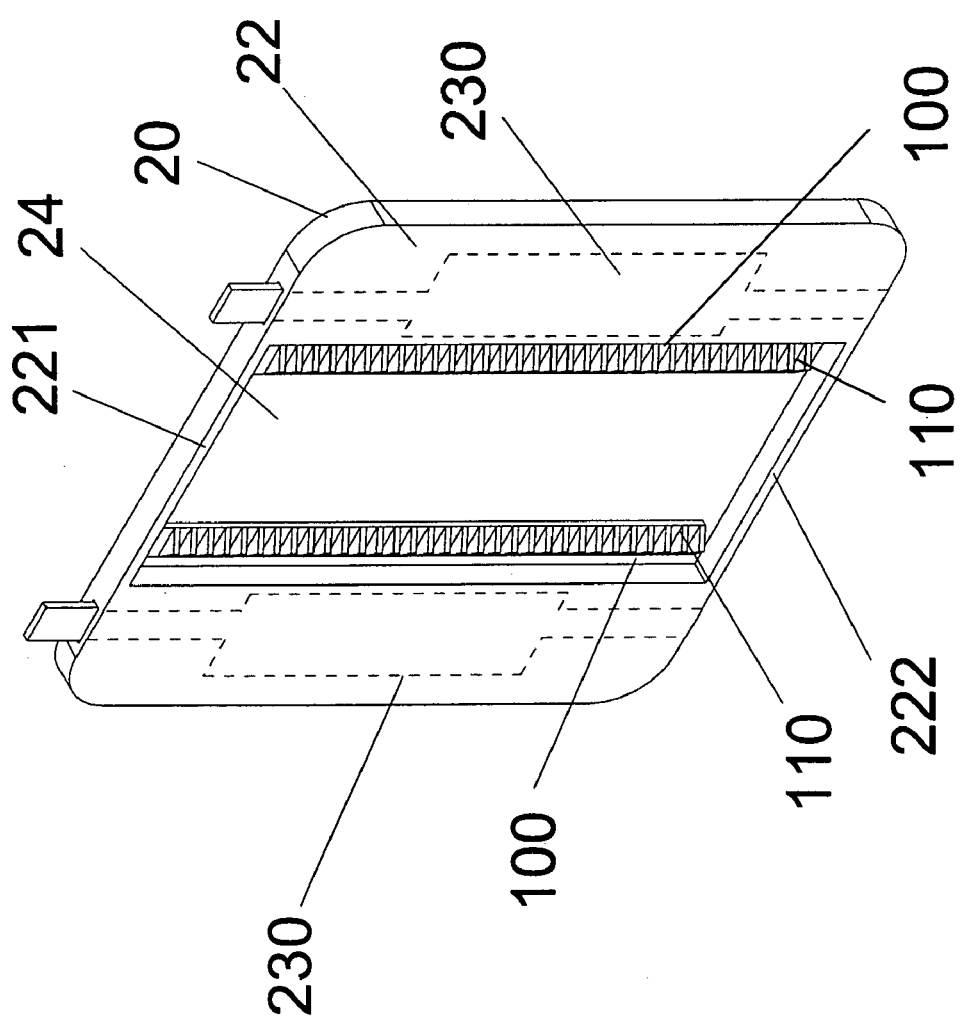
FIG. 2 is a view of door structure of a front opening unified pod (FOUP) of the prior art.
Figure 3:
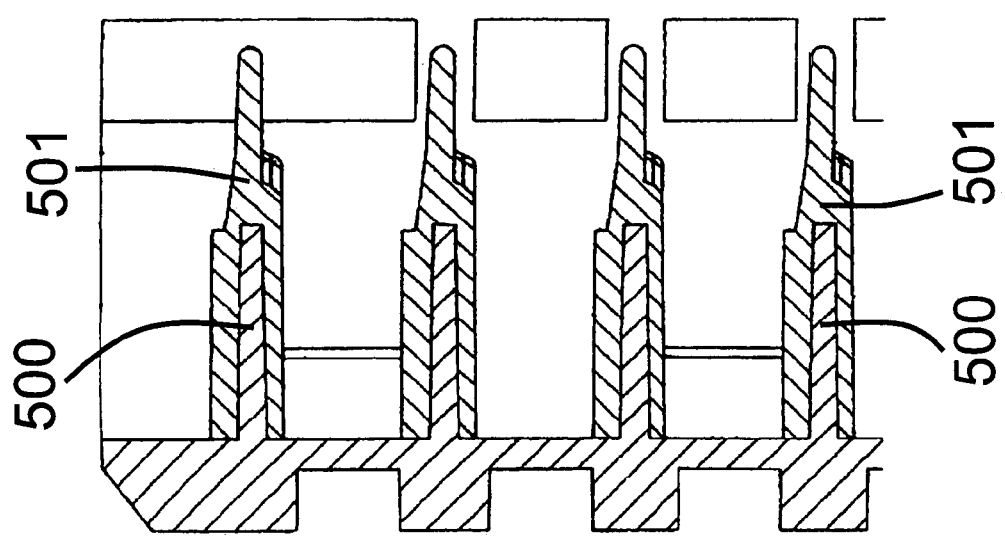
FIG. 3 is a sectional view of supporting module of a wafer container of the prior art.
Figure 4:
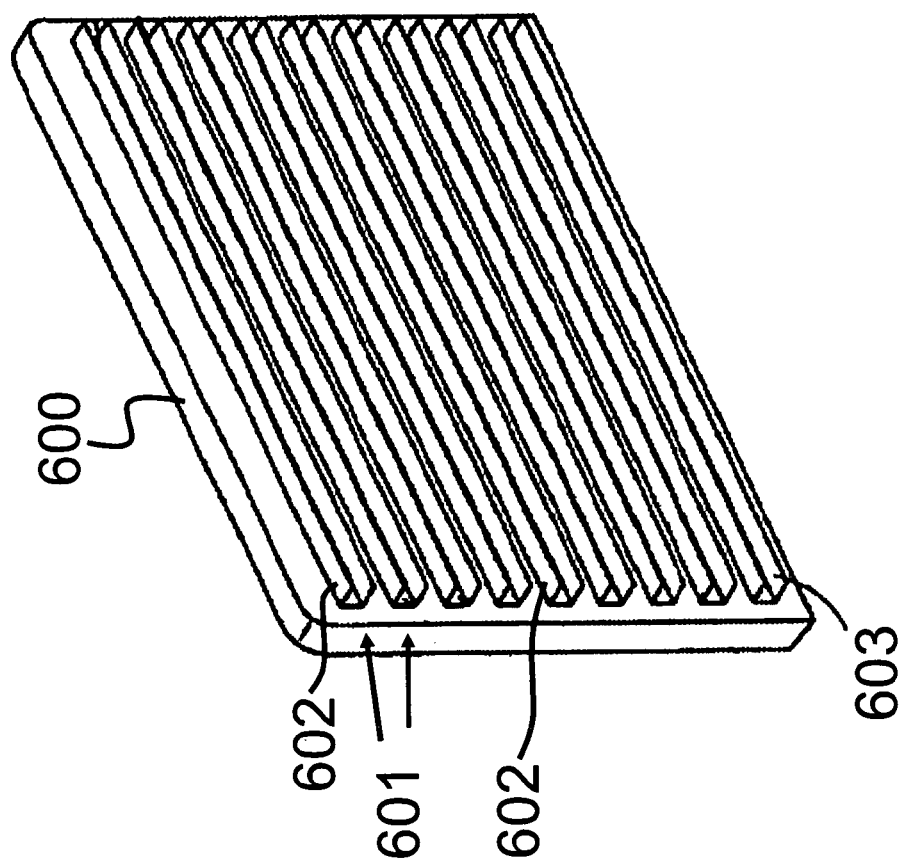
FIG. 4 is a view of inflatable supporting module of a wafer container of the prior art.
Figure 5:
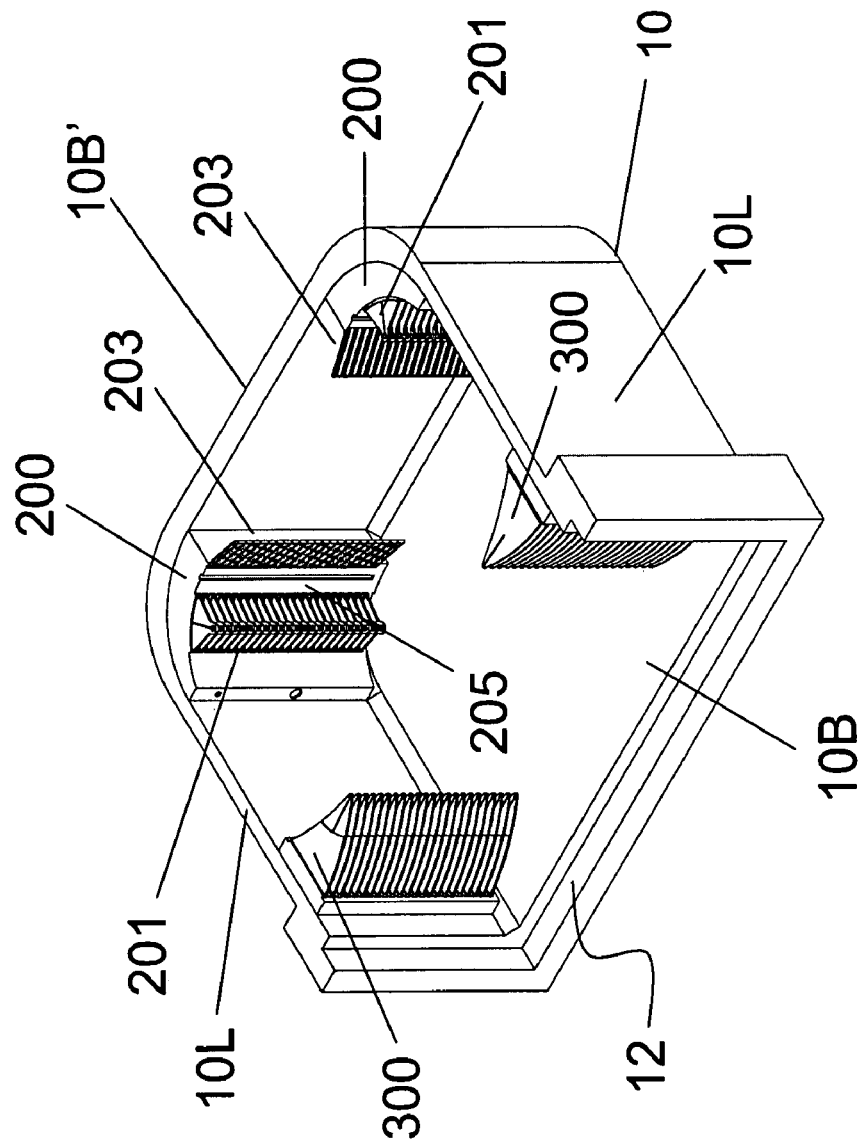
FIG. 5 is a perspective view of the container body of a front opening unified pod (FOUP) of the present invention.
Figure 6:
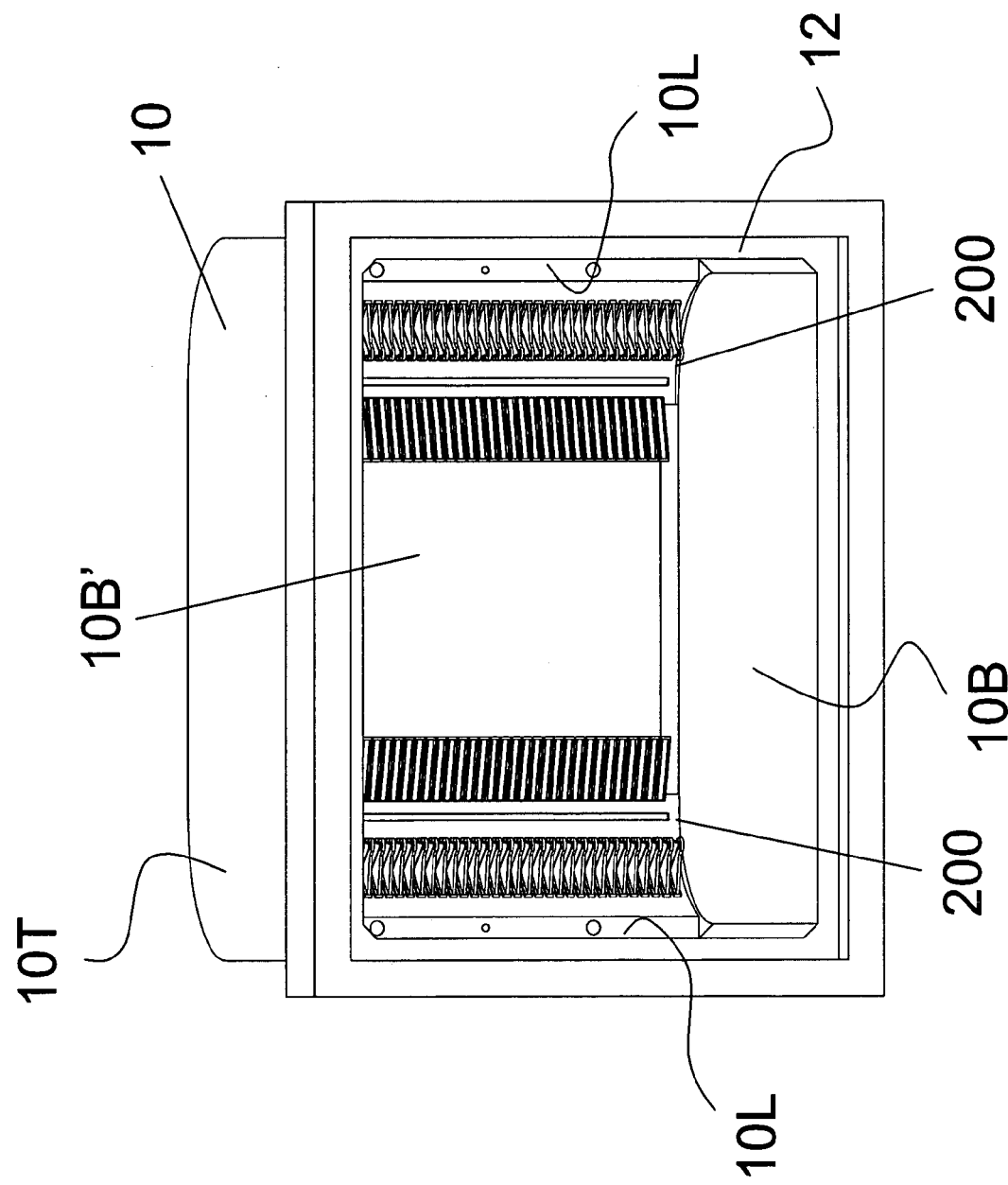
FIG. 6 is a view of the container body of a front opening unified pod (FOUP) of the present invention with only inflatable supporting module displayed.

First, referring to FIG. 5 and FIG. 6, which are a perspective view of the container body of a front opening unified pod (FOUP) of the present invention and a view of the container body with only inflatable supporting module shown. The container body 10 of the front opening unified pod (FOUP) is formed with a pair of sidewalls 10L and a top surface 10T and a bottom surface 10B adjacent to the pair of sidewalls 10L. An opening 12 is formed on one sidewall, and a back wall 10B' is formed on the other sidewall opposite to the opening 12. Wherein a pair of supporting modules 300 are disposed on the pair of sidewalls 10L near the opening 12, and an inflatable supporting module 200 is disposed respectively between the pair of sidewalls 10L and the back wall 10B'. The supporting module 300 can be in the form of supporting component in the prior art, which is not restricted in the present invention.

Figure 7A:
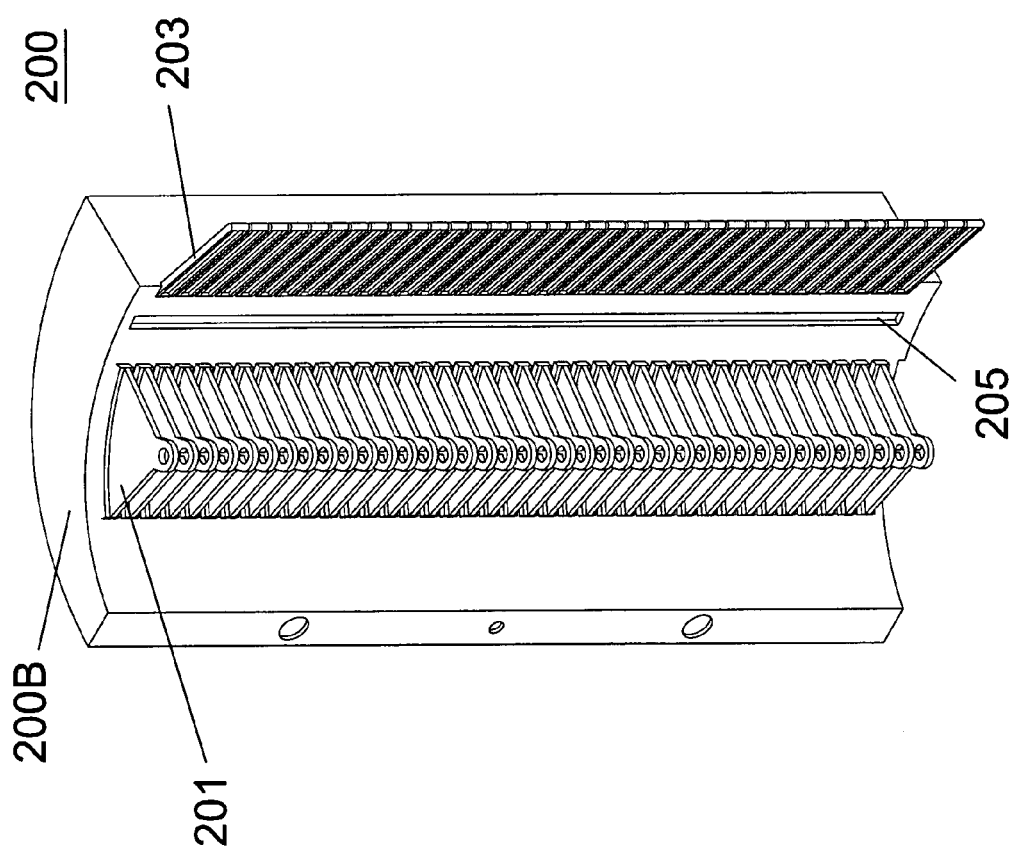
FIG. 7A is a frontal view of inflatable supporting module of a front opening unified pod (FOUP) of the present invention.
Figure 7B:
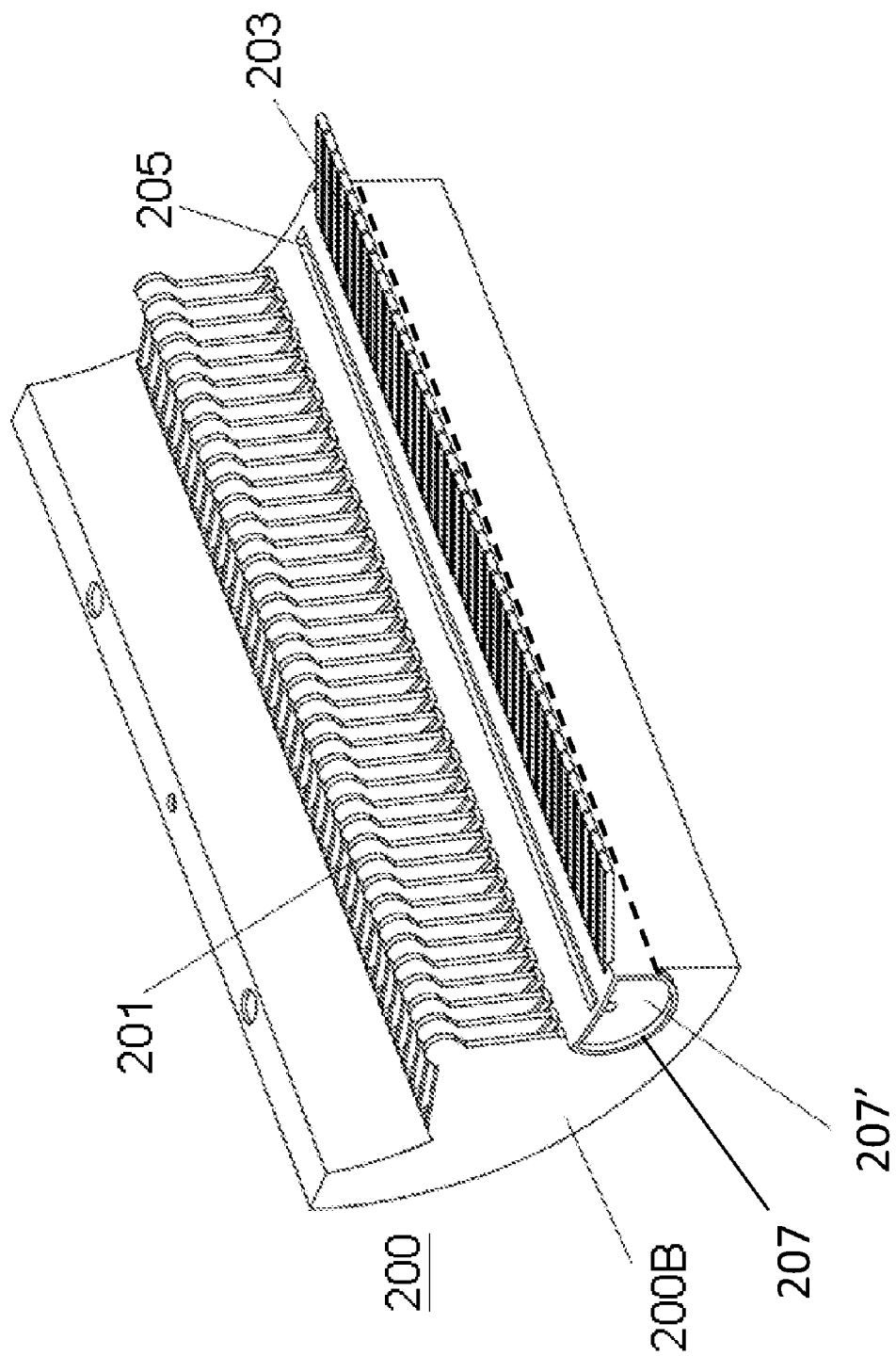
FIG. 7B is a bottom view of inflatable supporting module of a front opening unified pod (FOUP) of the present invention.

Then referring to FIG. 7A and FIG. 7B, which are a frontal view and a bottom view of an inflatable supporting module of the present invention. First, as shown in FIG. 7A, the inflatable supporting module 200 of the present invention mainly includes a main body 200B and two parts extending from the main body 200B, wherein the first part is composed of a plurality of supporting ribs 201 vertically arranged at intervals, and the second part is composed of a plurality of restraint components 203 vertically arranged at intervals, wherein a long slit 205 is formed on the main body 200B perpendicular to the main body 200B, the long slit 205 being disposed between the plurality of supporting ribs 201 and the plurality of restraint components 203. The long slit 205 is vertically adjacent to the plurality of supporting ribs 201 without overlapping, and the long slit faces the opening. A hollow conduit 207' can be further formed in the purgeable supporting module, and the hollow conduit is connected to the long slit 205.

Figure 8:
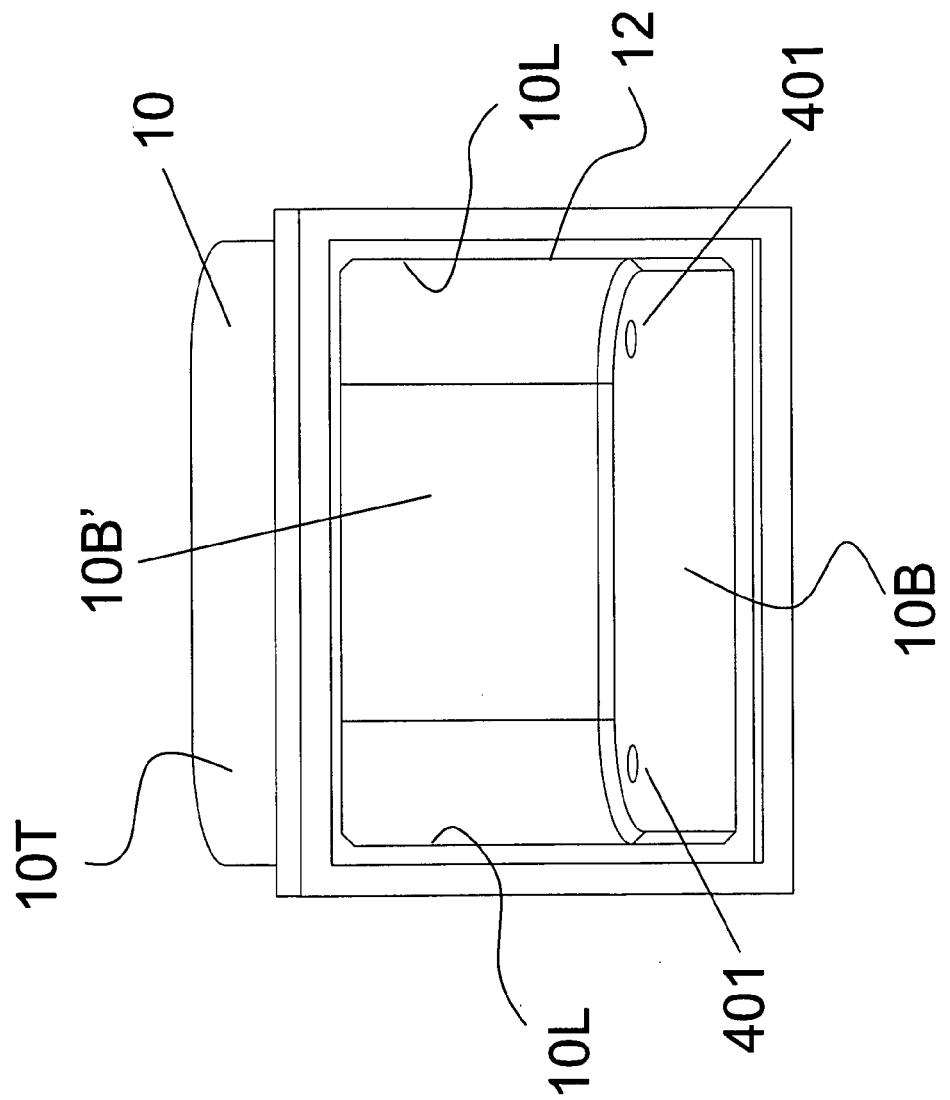
FIG. 8 is a view of a front opening unified pod (FOUP) of the present invention before being disposed with inflatable supporting module.

Moreover, please refer to FIG. 7B, in which a hollow conduit is included in the above-mentioned main body 200B, with a gas inlet 207 formed on one end of the hollow conduit and further connected to a gas valve or a gas inlet valve 401 of bottom surface 10B of container body 10 (referring to FIG. 8). Furthermore, the hollow conduit is connected to the above-mentioned long slit 205, and thus when the gas valve or gas inlet valve 401 of bottom surface 10B of container body 10 is connected to an inflation device (not shown in Figure), gas can be blown out from the long slit 205 through the gas inlet 207 and the hollow conduit. Since the width of the long slit 205 is quite small, the gas blown out is similar to air knife with enough air pressure to carry particles near wafers supported by supporting ribs 201 and restraint components 203 toward the direction of the opening 12 to prevent the particles from polluting the wafers. In addition, the width of long slit 205 can be gradually reduced from bottom toward top to make the air pressure of gas blown out more constant. The form of the above-mentioned long slit 205 can be bar-shaped or S-shape curved to change the direction in which the gas is blown out; and the gas blown out from the long slit 205 can include inert gases, cold dry air, nitrogen, or combination of any gases above.

Of course, another gas valve or gas outlet valve (not shown in FIG. 8) can also be disposed on the bottom surface 10B of container body 10 near the opening 12. When the inflation device inflated the container body 10, a small amount of gas in the container body 10 can be allowed to flow out from the gas valve or gas outlet valve near the opening 12, which not only allows particles in the container body 10 to be carried away but also reduces the time needed for fully inflating the container body 10. Without doubt the container body 10 of the present invention can include two pairs of gas inlet valves and gas outlet valves different from what is described above to meet the standard of front opening unified pod (FOUP).

Figure 9:
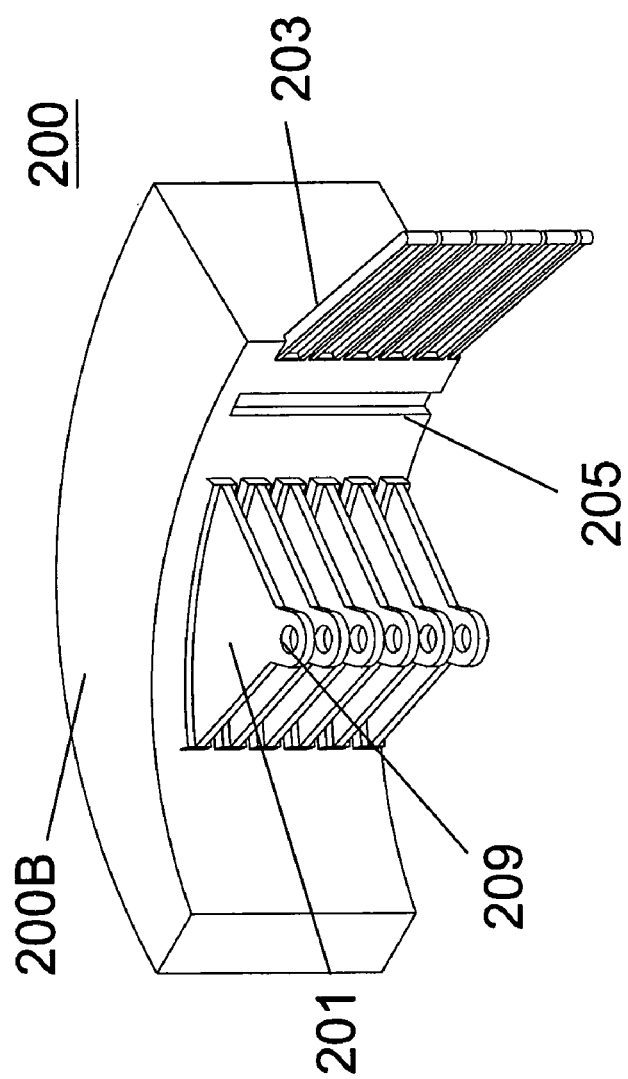
FIG. 9 is a magnified view of inflatable supporting module of a front opening unified pod (FOUP) of the present invention.
Figure 10:
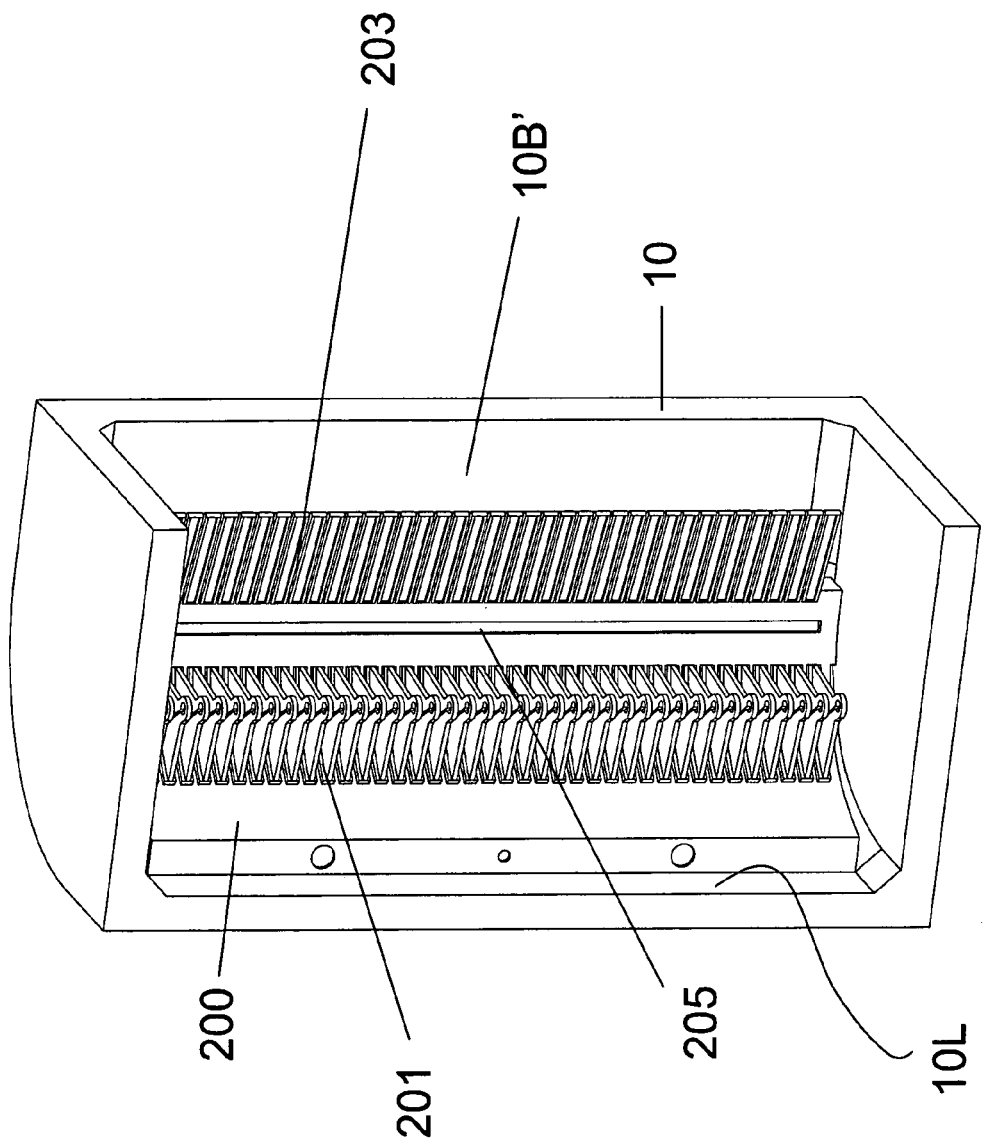
FIG. 10 is a view of part of a front opening unified pod (FOUP) disposed with inflatable supporting module.

Please then refer to FIG. 9, which is a magnified view of inflatable supporting module of the present invention. The inflatable supporting module 200 is composed of a plurality of supporting ribs 201, wherein each supporting rib is a structure similar to a platform and can be made of wear-resisting material such as PEEK material to prevent particles from being generated due to friction when wafers are supported by the supporting ribs 201 or the platform. Of course, as shown in FIG. 9, a supporting knob 209 can be further included on each of the supporting ribs 201 for contacting wafers to reduce the contact area of supporting ribs 201 with wafers and further reduce particles generated. Without doubt the supporting ribs 201 can be designed with only supporting knobs 209 as being made of a wear-resisting material and other parts not contacting wafers as non-wear-resisting material to reduce production cost. The plurality of restraint components 203 of inflatable supporting module 200 can be close to or suspended in front of the back wall 10B' (as shown in FIG. 10) for restricting the wafers supported by the supporting ribs 201 or supporting knobs 209 of supporting ribs 201 from moving toward the direction of back wall 10B' and preventing the wafers from colliding with the back wall 10B'. And the restraint components 203 can be flat pieces made of buffer material or wear-resisting material or shallow groove structure made of above-mentioned materials for holding wafers within this shallow groove structure. In addition, at least a restraint module (not shown in Figure) is further included on the inner surface of the door of the front opening unified pod (FOUP) for restricting wafers from moving toward the direction of the opening 12.

Figure 11A:
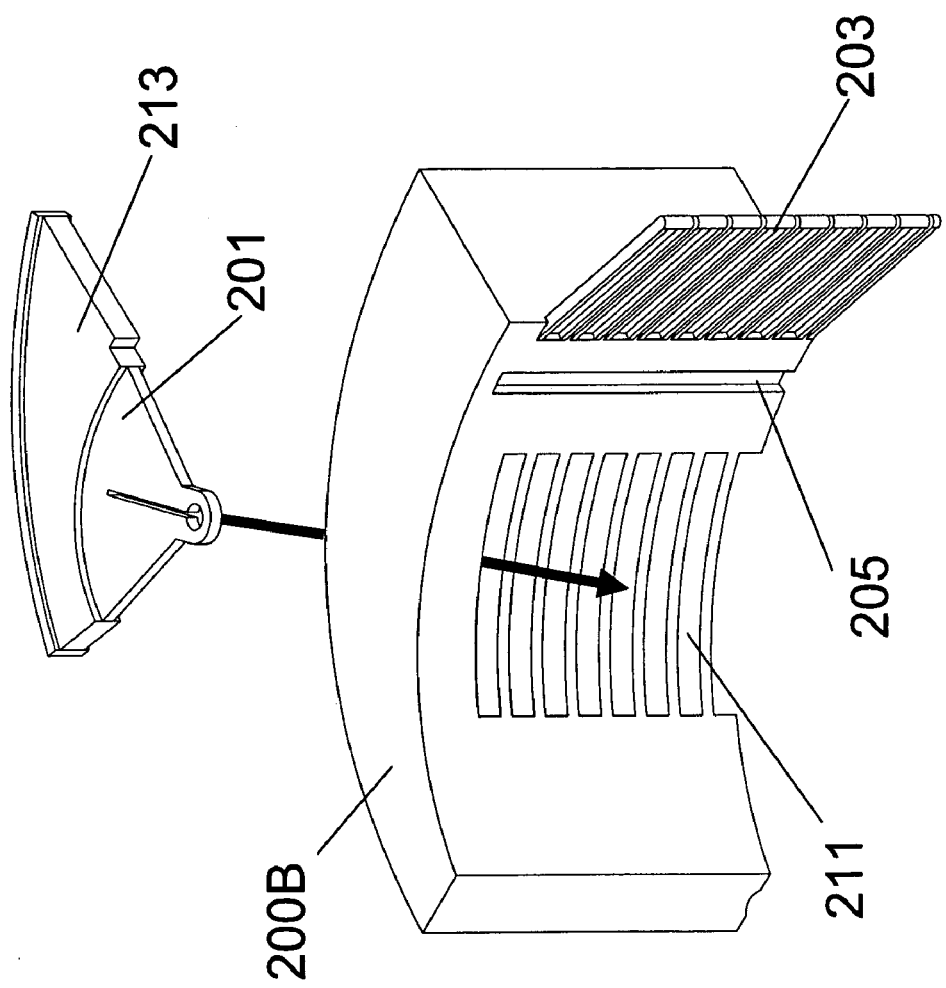

The inflatable supporting module 200 including a main body 200B, a plurality of supporting ribs 201 vertically arranged at intervals, a plurality of restraint components 203 vertically arranged at intervals, and a long slit 205 as described above can be an integrated structure to reduce the production cost. Of course, the inflatable supporting module 200 can also be formed with these components being assembled. As shown in FIG. 11A and FIG. 11B, two sides of the main body 200B of the inflatable supporting module 200 include a plurality of sockets 211 vertically arranged at intervals for a plurality of supporting ribs 201 to be inserted and assembled and fastened to the main body 200B to form a plurality of supporting ribs 201 arranged at intervals. And as the supporting ribs 201 are fastened to the main body 200B by assembling, each supporting rib 201 includes a fixed base 213 to be set into the main body 200B of the supporting module 200. Moreover, each supporting rib 201 can include a round hole 215 to be inlaid with a previously separated supporting knob 209 for the supporting knob 209 to be fastened on the supporting rib 201 and utilized for contacting wafers. And the supporting knob 209 can be made of a wear-resisting material such as PEEK material, and other parts that do not contact wafers can be made of non wear-resisting material to reduce production cost. In addition, the inflatable supporting module of front opening unified pod (FOUP) of the present invention can be composed of a main body 200B, a plurality of supporting ribs 201 vertically arranged at intervals, and a long slit 205, the structure of which allows wafers to be supported and particles near the wafers to be removed at the same time. Moreover, a plurality of gas outlet holes (not shown in Figure) can also be formed among the plurality of supporting ribs 201 vertically arranged at intervals for gas to be blown out from the long slit 205 and for particles near wafers to be carried away through the plurality of gas outlet holes. Of course the inflatable supporting module 200 can also be composed of a main body 200B, an array of plurality of supporting ribs 201 vertically arranged at intervals, another array of plurality of supporting ribs 201 vertically arranged at intervals, and a long slit 205, which is not restricted in the present invention. Furthermore, the door of front opening unified pod (FOUP) of the present invention can be like door in the prior art with a recess disposed on the inner surface of the door and with at least a latch component disposed between the outer surface and inner surface of the door which allow the wafer container to operate smoothly.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container including a container body formed by a top surface, a bottom surface and a pair of sidewalls, with an opening formed between said pair of sidewalls and a back wall formed opposite said opening, a pair of supporting modules being disposed on said pair of sidewalls for supporting a plurality of wafers; and a door with an outer surface and an inner surface, said door joining with said opening of said container body via said inner surface for protecting said plurality of wafers in said container body, the characteristic in that:

a purgeable supporting module is disposed respectively at a junction between each of said pair of sidewalls and said back wall of said container body, said purgeable supporting module comprising a main body, on which a plurality of supporting ribs extending out of said main body are vertically disposed at intervals in a row, a long slit being further disposed perpendicular to said main body, said long slit and said plurality of supporting ribs being vertically adjacent to each other without overlapping and said long slit facing said opening, a hollow conduit being further formed in said purgeable supporting module, said hollow conduit being connected to said long slit, wherein, a gas inlet is disposed on one end of said hollow conduit and connected to a gas valve on said bottom surface.

2. The wafer container according to claim 1, wherein at least a gas inlet valve and a gas outlet valve are further disposed on said bottom surface of said container body.

3. The wafer container according to claim 1, wherein a gas can be blown out from said long slit, and said gas is selected from the group consisting of the following: inert gases, cold dry air, and nitrogen.

4. The wafer container according to claim 1, wherein said purgeable supporting module can be an integrated structure.

5. The wafer container according to claim 1, wherein said purgeable supporting module includes a plurality of sockets for said plurality of supporting ribs to be inserted, assembled and fastened to said purgeable supporting module.

6. The wafer container according to claim 1, wherein material of said plurality of supporting ribs is a wear-resisting material.

7. The wafer container according to claim 1, wherein each of said plurality of supporting ribs includes a supporting knob for contacting wafers.

8. The wafer container according to claim 1, wherein each of said plurality of supporting ribs includes a round hole for a supporting knob to be inlaid and assembled.

9. The wafer container according to claim 7 or claim 8, wherein material of said supporting knob is a wear-resisting material.

10. The wafer container according to claim 7 or claim 8, wherein material of said supporting knob is PEEK material.

11. A wafer container including a container body formed by a top surface, a bottom surface and a pair of sidewalls, with an opening formed between said pair of sidewalls and a back wall formed opposite said opening, a pair of supporting modules being disposed on said pair of sidewalls for supporting a plurality of wafers; and a door with an outer surface and an inner surface, said door joining with said opening of said container body via said inner surface for protecting said plurality of wafers in said container body, the characteristic in that:
at least a purgeable supporting module is disposed respectively at a junction between one of said sidewalls and said back wall of said container body, said purgeable supporting module including a main body with one end disposed with a gas inlet and connected with a gas valve on said bottom surface, said purgeable supporting module further including an array of plurality of supporting ribs vertically arranged at intervals and another array of plurality of restraint components vertically arranged at intervals, said plurality of supporting ribs and said plurality of restraint components and said plurality of supporting modules on said pair of sidewalls together supporting said plurality of wafers, wherein at least a long slit is disposed between said plurality of supporting ribs and said plurality of restraint components and said long slit faces said opening, said long slit being vertically adjacent to said plurality of supporting ribs and said plurality of restraint components without overlapping.

12. The wafer container according to claim 11, wherein at least a gas inlet valve and a gas outlet valve are further disposed on said bottom surface of said container body.

13. The wafer container according to claim 11, wherein a gas can be blown out from said long slit, and said gas is selected from the group consisting of the following: inert gases, cold dry air, and nitrogen.

14. The wafer container according to claim 11, wherein said purgeable supporting module can be an integrated structure.

15. The wafer container according to claim 11, wherein said purgeable supporting module includes a plurality of sockets for said plurality of supporting ribs to be inserted, assembled and fastened to said purgeable supporting module.

16. The wafer container according to claim 11, wherein material of said plurality of supporting ribs is a wear-resisting material.

17. The wafer container according to claim 11, wherein each of said plurality of supporting ribs includes a supporting knob for contacting wafers.

18. The wafer container according to claim 11, wherein each of said plurality of supporting ribs includes a round hole for a supporting knob to be inlaid and assembled.

19. The wafer container according to claim 17 or claim 18, wherein material of said supporting knob is a wear-resisting material.

20. The wafer container according to claim 17 or claim 18, wherein material of said supporting knob is PEEK material.

21. The wafer container according to claim 11, wherein material of said plurality of restraint components of said purgeable supporting module is a wear-resisting material.

22. The wafer container according to claim 11, wherein material of said plurality of restraint components of said purgeable supporting module is PEEK material.

\* \* \* \* \*